(12) United States Patent
Hedler

(10) Patent No.: US 6,406,937 B1
(45) Date of Patent: Jun. 18, 2002

(54) METHOD FOR PRODUCING AN ELECTRICAL CONNECTION BETWEEN THE FRONT AND REAR SIDES OF SEMICONDUCTOR CHIPS

(75) Inventor: Harry Hedler, München (DE)

(73) Assignee: Infineon Technologies AG, Munich (DE)

( * ) Notice: Subject to any disclaimer, the term of this patent is extended or adjusted under 35 U.S.C. 154(b) by 40 days.

(21) Appl. No.: 09/658,713

(22) Filed: Sep. 11, 2000

(30) Foreign Application Priority Data

Sep. 10, 1999 (DE) .......................................... 199 43 385

(51) Int. Cl.$^7$ ................................................ H01L 21/44
(52) U.S. Cl. ........................ 438/108; 438/106; 438/114; 257/778
(58) Field of Search .......................... 257/778; 438/106, 438/108

(56) References Cited

FOREIGN PATENT DOCUMENTS

DE          197 31 346 A1        3/1999

Primary Examiner—Long Pham
Assistant Examiner—Ravi B. Shukla
(74) Attorney, Agent, or Firm—Laurence A. Greenberg; Werner H. Stemer; Gregory L. Mayback

(57) ABSTRACT

A method for producing an electrical connection between front and rear sides of semiconductor chips in the wafer process.

10 Claims, 2 Drawing Sheets

METHOD FOR PRODUCING AN ELECTRICAL CONNECTION BETWEEN THE FRONT AND REAR SIDES OF SEMICONDUCTOR CHIPS

BACKGROUND OF THE INVENTION

Field of the Invention

The invention relates to a method for producing an electrical connection between front and rear sides of semiconductor chips.

In certain integrated circuits or semiconductor chips, the substrate has to be connected to a predetermined reference-ground potential (e.g. ground) for the functionality of the circuit. This is usually done by connecting the rear side of the chip, that is to say a substrate side, to the reference-ground potential.

When housing semiconductor chips, this can be done by making contact with the rear side of the chip using a module terminal provided for this purpose. When the semiconductor chip is applied to a lead frame, the rear side of the semiconductor chip is connected directly to a metal area of the lead frame. The metal area may in turn be contact-connected to a module terminal connected to the predetermined reference-ground potential during operation of the circuit, or, internally in the housing, to a terminal or pad connected to the predetermined reference-ground potential. What is essential in this case is that contact be made with the rear side of the chip in the process of housing the semiconductor chip.

However, when the semiconductor chip is mounted without a housing, for example by being bonded to a printed circuit board, other methods are required for making contact with the rear side of the chip.

In the case of so-called flip-chip technology, in particular, only rewiring configurations and a solder ball structure are provided on the front side of the chip, that is to say the chip surface. In this case, the semiconductor chip is placed with the front side of the chip facing down (which explains the expression "flip-chip") on a substrate which, similarly to a printed circuit board, has a wiring structure for connecting the semiconductor chips to be mounted on the substrate, and is electrically connected to the substrate by heating the solder balls. The rear side of the chip, which is now uncovered, has to be connected separately to the reference-ground potential. This can be done for example by reverse contact-making from the rear side of the chip to the front side of the chip.

SUMMARY OF THE INVENTION

It is accordingly an object of the invention to provide a method for producing an electrical connection between the front and rear sides of semiconductor chips which overcomes the above-mentioned disadvantages of the prior art devices of this general type, which enables a reliable electrical connection of front and rear sides of the semiconductor chips in a simple manner.

With the foregoing and other objects in view there is provided, in accordance with the invention, a method for producing electrical connections. The method includes providing a wafer; applying a sheet defining separating lines on a rear side of the wafer; and dividing the wafer along the separating lines into semiconductor chips each having a front side and a rear side. A metal nucleating-agent layer is applied in a region of the separating lines at least in sections onto a front side of the wafer and also on an edge region, contiguous therewith, of the semiconductor chips. The metal nucleating-agent layer is then irradiated to produce metal nuclei on a surface of the metal nucleating-agent layer. At least one interconnect is formed which is contiguous on the front side and the edge region and extends as far as the rear side of the semiconductor chips, by chemical metallization on an irradiated section of the surface of the metal nucleating-agent layer of each of the semiconductor chips.

In accordance with an added feature of the invention, there are the steps of providing the sheet with perforations for applying the metal nucleating-agent layer on the rear side of the semiconductor chips in the region of the separating lines; and covering the rear side of the semiconductor chips, at least in sections, with the metal nucleating-agent layer.

Published, Non-Prosecuted German Patent Application DE 197 313 46 discloses a method for producing interconnect structures on a non-conductive carrier material. In this method, a metal nucleating-agent layer containing heavy metal complexes is applied to a non-conductive carrier material. For this purpose, the layer material contains microporous or microrough carrier particles to which organic, non-conductive heavy metal complexes are bound. In the region of interconnect structures to be produced, the metal nucleating-agent layer is irradiated with electromagnetic radiation in the UV range, as a result of which heavy-metal nuclei are liberated. The carrier particles are uncovered by ablation and the heavy-metal nuclei are liberated by the bound heavy metal complex being broken open. The irradiated region is subsequently metallized chemically-reductively in order to form interconnect structures. An essential concept of the invention is the adaptation of the method disclosed in the German Patent Application DE 197 313 46 A1 for chip rear-side and front-side connection still during the wafer process and the German Patent Application DE 197 314 46 A1 is hereby incorporated by reference.

According to the invention, in particular after the wafer has been sawn into semiconductor chips, which are still situated on the sawing sheet, the metal nucleating-agent layer, in particular a photosensitive resist, is applied at least in sections onto the front side and also the edges of the semiconductor chips.

In the region of interconnects to be produced for the front-/rear-side reverse contact-making of the semiconductor chips, heavy-metal nuclei are formed in the heavy-metal-containing layer by irradiation. Electrically conductive regions are then formed on the heavy-metal nuclei layers by chemical metallization, which regions extend at least partly from the front side over the edges as far as the rear side of the semiconductor chips. The regions abut a metallized rear side and form electrical connections from the front side to the rear side of the semiconductor chips.

One advantage of the method is to be seen in the fact that it is possible, in a reliable and simple manner, to form well-adhering interconnects for making contact with the front and rear sides of a semiconductor chip during the process for producing the semiconductor chips. As a result, the rear side, that is to say the substrate side, of the semiconductor chips is electrically connected to the front side, and making contact with the rear side separately in a subsequent production step, for example during the housing process, is obviated. Therefore, this method is especially suitable for mounting the semiconductor chips without a housing or for "flip-chip" technology.

In order to obtain a particularly reliable electrical connection between the front and rear sides of the semiconductor chips, the rear side is preferably also covered at least partly with the metal nucleating-agent layer and the further method steps are also applied to these rear-side regions. This produces wiring configurations between the front and rear sides of the semiconductor chips which cover parts both of the front side and of the rear side of the semiconductor chips and reliably make contact with the latter.

In accordance with an additional feature of the invention, there is the step of providing the metal nucleating-agent layer with one of microporous and microrough carrier particles in a uniform distribution, the metal nuclei form on a surface of the carrier particles in the irradiating step.

In accordance with another feature of the invention, there is the step of applying the metal nucleating-agent layer using wafer-scale printing technology.

In accordance with a further feature of the invention, there is the step of providing the metal nucleating-agent layer with an organic non-conductive heavy-metal complex.

The metal nucleating-agent layer is preferably applied essentially in the region of the separating lines (sawing lines) of the wafer between the semiconductor chips. In a particularly preferred manner, the metal nucleating-agent layer essentially covers the corners of the semiconductor chips. Particularly when using wafer-scale printing technology to apply the heavy-metal-containing layer, it is advantageous to apply the metal nucleating-agent layer only in the above-mentioned regions, in order, on the one hand, to save material and, on the other hand, to avoid additional steps for producing layer sections that are not necessary for the reverse contact-making.

The application of the metal nucleating layer on the rear side of the wafer or the semiconductor chips is made more difficult by the sawing sheet, however, so that the sheet is preferably perforated on the rear side of the semiconductor chips. Perforation of the sawing sheet is provided in particular in the region of the sawing lines and of the corners of the semiconductor chips. The metal nucleating-agent layer is especially applied, for example printed or sprayed, in the form of circular regions onto the points of intersection of the sawing line. One circular region of the metal nucleating-agent layer at a point of intersection of two sawing lines advantageously covers four semiconductor chips, that is to say the corners of four different semiconductor chips, with the result that a rear side connection for the semiconductor chips of a wafer can be produced by this process in a simple manner merely using relatively few perforations or regions of the heavy-metal-containing layer.

The metal nucleating-agent layer preferably has palladium or palladium compounds in complex form. These require, for initiating structuring cleavage reactions, irradiation with a significantly lower energy density than other heavy-metal compounds.

The targeted irradiation is preferably effected by a mask aligner or stepper. The mask aligner or stepper operates with UV radiation that liberates palladium or palladium compounds on the surface of the layer for the formation of palladium nuclei layers. Mask aligners or steppers are used in semiconductor technology for exposing the wafers with the structures predetermined by exposure masks. This enables the method according to the invention to be incorporated in a simple manner in the method sequence or process sequence for producing integrated circuits, for example by providing a special mask for exposing the heavy-metal-containing layers.

The light radiation may preferably be produced by a laser (especially a KrF excimer laser where $\lambda=248$ nm), the small beam diameter of which enables particularly fine interconnects or electrical connections to be formed. Furthermore, the high radiation intensity of the laser affords the advantage that the heavy-metal layer only has to be irradiated very briefly in order to form heavy-metal nuclei layers.

In the chip composite, that is to say when the semiconductor chips are still bonded on the sawing sheet, it is possible to bore into the layer in a targeted manner during the targeted irradiation by a laser by increasing the radiation intensity (focussing) thereof. Since the unfocussed laser radiation used for surface activation only penetrates the layer surface, this is necessary for forming vertical heavy-metal nuclei layers on the edges of the semiconductor chips. In the region of the sawing lines, this enables the vertical nucleation, that is to say formation of heavy-metal nuclei layers along the chip edges. On account of the focussing, the laser radiation penetrates deeply into the layer at the boring location and nucleates the edges of the bored hole. Consequently, the interconnect can "grow" into the bored hole during subsequent metallization.

The method according to the invention also makes it possible to produce rewiring configurations of individual interconnects from the pads to the rear side of the chip. This is advantageous in particular for stacking the semiconductor chips to form multichip modules or for memory stacking (chip stacking).

Other features which are considered as characteristic for the invention are set forth in the appended claims.

Although the invention is illustrated and described herein as embodied in a method for producing an electrical connection between the front and rear sides of semiconductor chips, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
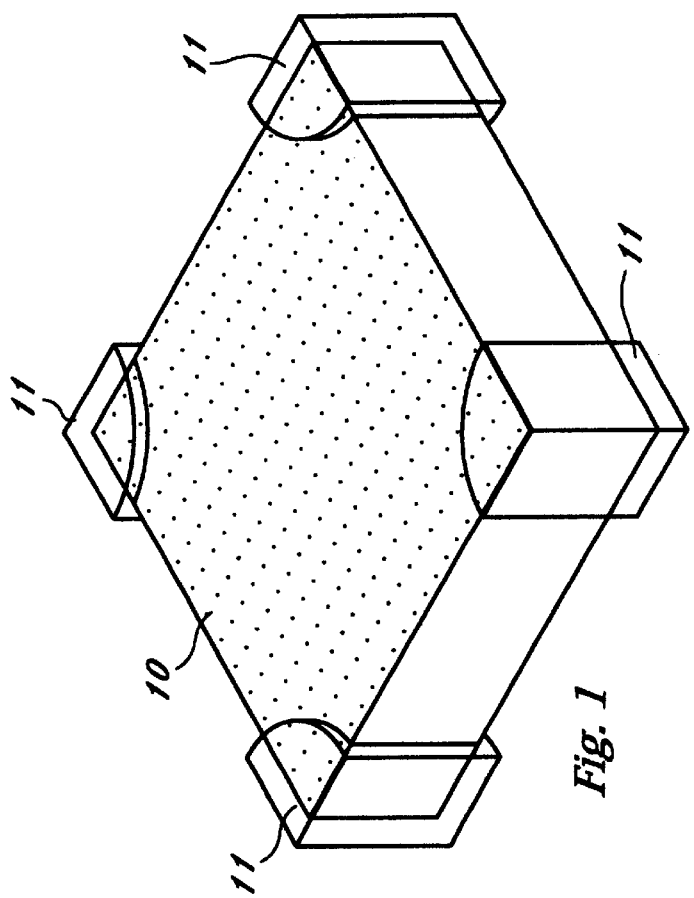
FIG. 1 is a diagrammatic, perspective view of an exemplary embodiment of an electrical connection of front and rear sides of a semiconductor chip, according to wafer-scale printing technology, according to the invention.

In all the figures of the drawing, sub-features and integral parts that correspond to one another bear the same reference symbol in each case. Referring now to the figures of the drawing in detail and first, particularly, to FIG. 1 thereof, there is shown an exemplary embodiment of a semiconductor chip 10 having electrical connections 11 between front and rear sides of the semiconductor chip 10. In this case, the electrical connections 11 are in the form of a covering encapsulating the corners of the semiconductor chip 10. The form of the covering 11 is produced by a method that uses wafer-scale printing technology and is described below.

Figure 2:
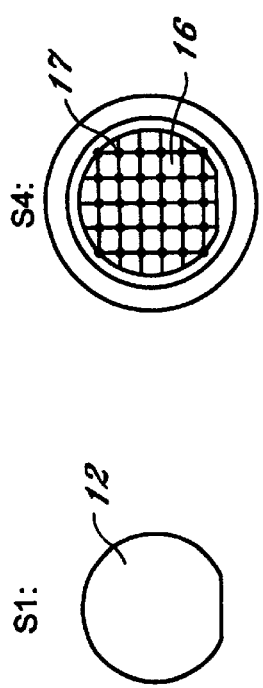
FIG. 2 is a rear-elevational view of a wafer during method steps for connecting the front and rear sides of semiconductor chips of the wafer using wafer-scale printing technology.

The steps for carrying out the method are illustrated in FIG. 2. In a first step S1, the rear side of a wafer 12 is coated with palladium-doped resist in a whole-area manner, for example by spluttering metallization or by mask printing, and is subsequently metallized by chemical metallization. The metallization is necessary in order to connect the rear sides of the chips, that is to say in order to form substrate terminals of the individual semiconductor chips, to a predetermined reference-ground potential.

After the metallization of the rear side of the wafer, in a second step S2, the wafer 12 is bonded onto a perforated sawing sheet 13 in such a way that the metallized rear side of the wafer is adhesively connected to the sheet. In this case, perforations 14 of the sawing sheet 13 define the printing positions for the electrical connections illustrated in FIG. 1, which cover the chip corners, between the chip rear side and the front side. For this purpose, the perforations 14 lie, in particular, above sawing lines 15 of the wafer 12 and are formed as openings with a size such that the wafer 12 can thus be coated with resist.

In a third step S3 of the method, the wafer is sawn into semiconductor chips 16 and, if appropriate, stretched.

In a fourth step S4, a palladium-doped resist is applied by use of wafer-scale printing technology both on the front side and on the rear side of the sawn wafer 12. Resist is applied on the front side and on the rear side of the wafer in particular in the form of circular regions 17 in such a way that it covers the points of intersection of the sawing lines and thus the respective corners of four semiconductor chips 16. For a good electrical connection between the front side and the rear side of a semiconductor chip, it is advantageous to perform the electrical connection or wiring from the front side to the rear side of the semiconductor chip at the four corners thereof. The method outlined above, with a low outlay, is particularly well suited to doing this. For an even better electrical connection, however, it is also possible to cover for example the whole of the sawing lines 15 of the sawn wafer 12 with resist. In this case, after the method, the edges of each semiconductor chip 16 are covered by an electrically conductive connection between the front side and the rear side thereof.

In a fifth step S5, the resist that was applied in the fourth step S4 is then exposed both on the front side and on the rear side of the wafer by a UV laser 50. The laser effects nucleation, that is to say the formation of palladium nuclei layers, in the resist, which serve for metallization and, in particular, for formation of interconnects in a subsequent step. Depending on the desired reverse contact-making, the laser 50 can either expose all resist regions of the wafer 12 in a whole-area manner or "write" interconnects into the resist regions of the wafer 12.

"Writing" the interconnects into the resist layers enables particularly fine interconnects to be produced. This is expedient for example in the stacking of semiconductor chips (chip stacking). In this case, the fine interconnects proceeding from a plurality of points on the front side of the semiconductor chip 16 are wired to the rear side of the semiconductor chip (which must not be completely metallized for this purpose), in order to be electrically connected there by solder balls, for example, to metallization pads on the front side of a further semiconductor chip stacked onto the semiconductor chip.

Instead of laser radiation, it is also possible to expose the resist using exposure masks known from semiconductor fabrication. This method requires a shorter total exposure time than exposure using a laser that exposes the individual resist regions one after the other in time. By use of the mask technique, areally a very large region, in particular the entire wafer 12, can be exposed simultaneously. The method is particularly suitable for efficient and rapid mass production of the wiring between the front and rear sides of the semiconductor chips.

In a sixth step S6, the exposed resist 18 is metallized chemically-reductively by the deposition of, for example, Cu or Ni or Au on the exposed regions. The exposed regions 18 are thus made into metallized regions 19. What has a particularly advantageous effect in this case is the strong binding action of the palladium nuclei layers, which bring about great adhesion of the wiring configurations or electrical connection despite the uneven chip edges which additionally make it more difficult for interconnects to adhere. Moreover, during the chemical metallization, the palladium nuclei layers have the effect that particularly thick interconnects or electrical connections form on the exposed resist. This results in a reduction in the resistance of the wiring configuration and thus in a high current conductivity of the wiring configuration.

Figure 3:
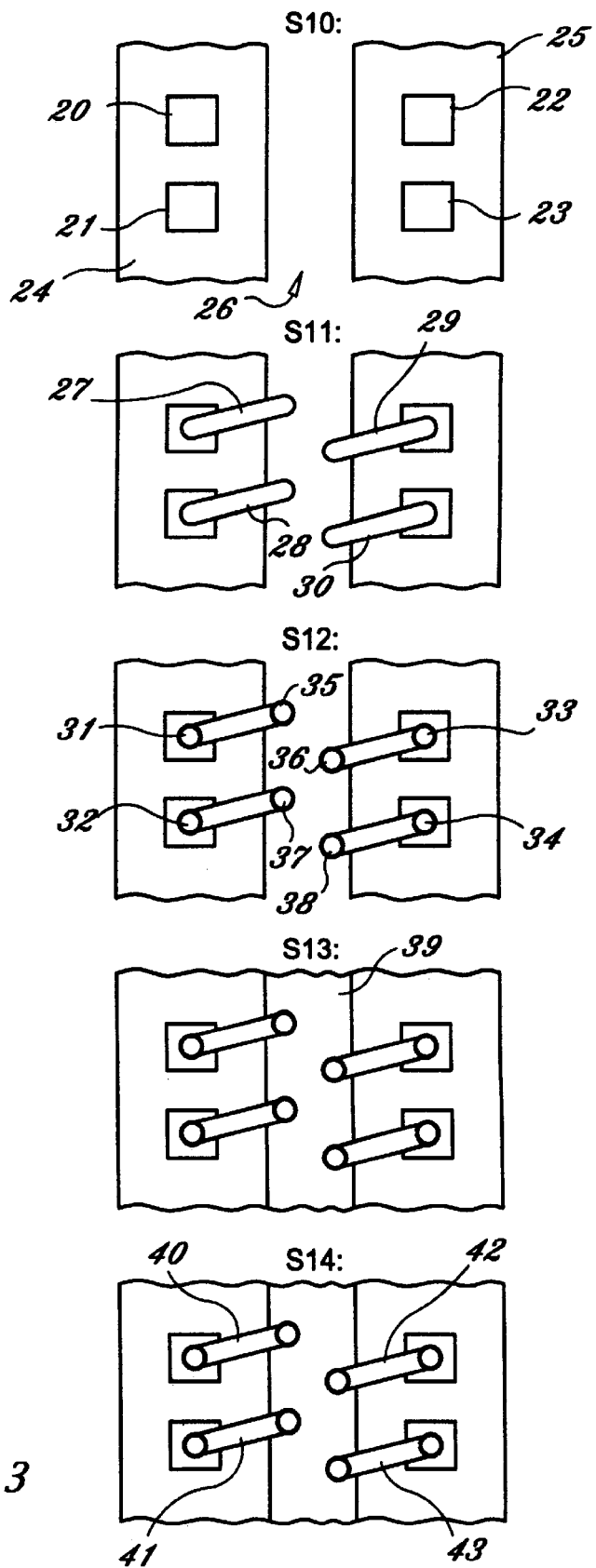
FIG. 3 is a plan view of the method steps for producing a fine-pitch rewiring configuration from the front side to the rear side of the semiconductor chips for chip stacking.

FIG. 3 illustrates the application of the method for producing a fine-pitch wiring configuration, that is to say a wiring configuration having very fine interconnects, from the front side to the rear side of semiconductor chips 16 for chip stacking or the formation of multi-chip modules.

To prepare for the wiring, aluminum pads 20–23 of semiconductor chips 24–25 are covered by a zincate process.

In a first step S10 of the method, the already sawn wafer is covered with a heavy-metal-containing layer, in particular a palladium-doped resist, completely in the region of the sawing clamping ring. Both the edges and in particular pads of the semiconductor chips 24–25 and sawing lines 26 between the semiconductor chips 24–25 of the wafer are covered.

In a second step S11, proceeding from each pad 20–23, interconnect structures 27 to 30 are exposed in the region of the sawing line 26 preferably by a laser. The exposure effects nucleation, that is to say forms heavy-metal nuclei layers on the surface of the heavy-metal-containing layer (lateral nucleation).

In a third step S12, the resist is bored into by focussed laser radiation on the sawing line 26 and on the pad in each case at the ends of the interconnect structures 27–30 which were exposed in the second step. As a result of the boring by the laser, the metal nucleating-agent layer is simultaneously nucleated vertically in the laser bores 31–35, that is to say heavy-metal nuclei layers are formed on the wall of the hole bored into the layer.

In a fourth step S13, the unexposed resist sections 39 are dissolved out chemically by development. Only the exposed regions of the resist remain. Only the resist-free region 24 on the sawing line 26 of the wafer is illustrated in the figures.

Finally, in a fifth step S14, chemically reductive metallization, in particular using Cu or Ni or Au, of the nucleated layers is carried out in order to form interconnects on the structures 27–30. In this step, the heavy-metal nuclei layers produced by the lateral and vertical nucleation are metallized by Cu or Ni or Au being selectively deposited on the interconnect structures. Sufficiently thick metallized interconnects 40–43, which have high adhesive strength, are formed in the process.

The material for the metal nucleating-agent layer preferably contains microporous or microrough carrier particles whose surface exercises an adhesion promoter effect with regard to the heavy-metal nuclei dissolved out of the heavy-metal complex. During the metallization which follows the irradiation for the purpose of surface activation, the metal used grows into the pores of the carrier particles, thereby achieving excellent adhesion of the metallization layer even on the edges between the front side and edge region or between the edge region and rear side of the chips. In addition to breaking open the organic, non-conductive heavy-metal complex that is preferably used, the irradiation uncovers the micropores on the particle surface. The carrier particles should preferably be resistant to the activation radiation, so that inorganic-mineral carrier particles are preferably used.

Carrier particles made of pyrogenic silicic acid having a BET surface area of more than 100 m$^2$/g or aerogels are particularly suitable. The metal nucleating agent and the carrier particles are embedded in a polymer or resist matrix known per se which can easily be applied to the chip surface by known resist coating methods appertaining to semiconductor technology and has a good adhesive strength there.

The metallization following the surface activation is effected using a chemical-reductive metallization method known per se, for example in a copper bath without external current.

The embodiment of the invention is not restricted to the examples described above but rather is also possible in a multiplicity of modifications within the scope of expert action.

The metal nucleating-agent layer is irradiated with electromagnetic radiation whose wavelength is matched specifically to the layer material, in particular to the activation properties of the metal compound used. Whereas, as mentioned above, UV light, especially at a wavelength of around 250 nm, is advantageously used in the case of Pd complex compounds, radiation from the visible light region through to the x-ray region may be expedient for other compounds. For the last-mentioned region, too, fundamentally known installations are available for realizing the method, as have been utilized for a relatively long time in x-ray and electron beam lithography in semiconductor technology.

Depending on the necessity of the specific case of use, the irradiation may be combined with a thermal treatment—however, in the interest of high boundary definition of the activated surface regions and thus of an advantageous edge definition of the interconnects that are ultimately obtained, the work is preferably carried out without additional heating.

I claim:

1. A method for producing electrical connections, which comprises the steps of:
   providing a wafer;
   applying a sheet defining separating lines on a rear side of the wafer;
   dividing the wafer along the separating lines into semiconductor chips each having a front side and a rear side;
   applying a metal nucleating-agent layer in a region of the separating lines at least in sections onto a front side of the wafer and also on an edge region, contiguous therewith, of the semiconductor chips;
   irradiating the metal nucleating-agent layer to produce metal nuclei on a surface of the metal nucleating-agent layer; and
   forming at least one interconnect which is contiguous on the front side and the edge region and extends as far as the rear side of the semiconductor chips, by chemical metallization on an irradiated section of the surface of the metal nucleating-agent layer of each of the semiconductor chips.

2. The method according to claim 1, which comprises:
   providing the sheet with perforations for applying the metal nucleating-agent layer on the rear side of the semiconductor chips in the region of the separating lines; and
   covering the rear side of the semiconductor chips, at least in sections, with the metal nucleating-agent layer.

3. The method according to claim 1, which comprises applying the metal nucleating-agent layer in a form of a circle onto points of intersection of the separating lines.

4. The method according to claim 1, which comprises applying the metal nucleating-agent layer such that it covers corner regions of the semiconductor chips.

5. The method according to claim 1, which comprises providing the metal nucleating-agent layer with one of microporous and microrough carrier particles in a uniform distribution, the metal nuclei forming on a surface of the carrier particles in the irradiating step.

6. The method according to claim 1, which comprises applying the metal nucleating-agent layer using wafer-scale printing technology.

7. The method according to claim 1, which comprises providing the metal nucleating-agent layer with an organic nonconductive heavy-metal complex.

8. The method according to claim 7, which comprises providing the metal nucleating-agent layer with one of a Pd complex and a Pd-containing complex.

9. The method according to claim 1, which comprises during the irradiating step, carrying out targeted irradiation of predetermined regions of the metal nucleating-agent layer by one of a mask aligner and a stepper for targeted production of metal nuclei.

10. The method according to claim 1, which comprises carrying out the irradiating step using a UV laser, such that interconnect structures are exposed, and radiation of the UV laser is focussed onto ends of structures such that holes are bored into the metal nucleating-agent layer, the metal nuclei being produced on walls of the holes.

* * * * *